United States Patent [19]
Nakamura

[11] Patent Number: 6,054,759
[45] Date of Patent: *Apr. 25, 2000

[54] SEMICONDUCTOR CHIP AND PACKAGE WITH HEAT DISSIPATION

[75] Inventor: Hisashi Nakamura, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/092,176

[22] Filed: Jun. 5, 1998

[30] Foreign Application Priority Data

Jan. 8, 1998 [JP] Japan .................................. 10-002506

[51] Int. Cl.$^7$ .................................................. H01L 23/52
[52] U.S. Cl. .......................... 257/691; 257/693; 257/685; 257/688; 257/778; 257/690; 257/734; 257/737; 257/738; 361/729; 361/730; 361/735; 361/761; 361/783; 361/790
[58] Field of Search ..................................... 257/691, 693, 257/685, 688, 777, 778, 700, 690, 734, 737, 738, 735; 361/729, 730, 735, 761, 783, 790

[56] References Cited

U.S. PATENT DOCUMENTS

| | | |
|---|---|---|
| 5,239,198 | 8/1993 | Lin et al. ................................. 257/693 |
| 5,808,357 | 9/1998 | Sakoda et al. .......................... 257/691 |

FOREIGN PATENT DOCUMENTS 7-50368  2/1995  Japan .

*Primary Examiner*—Tom Thomas
*Assistant Examiner*—Luan Thai
*Attorney, Agent, or Firm*—McDermott, Will & Emery

[57] ABSTRACT

A semiconductor chip is die-bonded on a tape. A plurality of electrodes for power supply for supplying power are formed at an upper surface of the semiconductor chip, and a plurality of electrodes for signal communication for communicating signals are formed at a lower surface of the semiconductor chip. The semiconductor chip, the tape and the like are sealed within a package. A power supply wiring formed external to the package is connected to an electrode for power supply. Thus, a semiconductor device is obtained which efficiently releases the heat generated at the semiconductor chip and contemplates increasing the number of electrodes for signal communication.

4 Claims, 5 Drawing Sheets

SEMICONDUCTOR CHIP AND PACKAGE WITH HEAT DISSIPATION

BACKGROUND OF THE INVENTION

1. Field of the Invention

The present invention relates to a semiconductor device, and particularly to a semiconductor device capable of efficiently releasing the heat generated in operation.

2. Description of the Background Art

In recent years, there has been an increasing demand for rapid operation of integrated circuits (ICs) to process mass information. Accordingly, the number of signal pins provided in ICs is also increased for inputting and outputting predetermined signals. Furthermore, increasing electricity consumption of ICs results in increasing the number of power supply pins for supplying power.

Also, there has been a demand for a package sealing a semiconductor chip that is closer in size to the semiconductor chip so as to achieve mounting at high density.

As a first prior art, as an exemplary semiconductor device including a package which seals a semiconductor chip will now be described with reference to the drawings. FIG. 7 shows the structure of a fine-pitch ball grid array (referred to as "a fine-pitch BGA" hereinafter). Referring to FIG. 7, a semiconductor chip 102 is die-bonded on one surface of a glass sheet (referred to as a "tape" hereinafter) 106 impregnated with epoxy resin with an adhesion layer interposed therebetween. Formed near a periphery of tape 106 are a plurality of pad electrodes 107, each electrically connected to a predetermined region of semiconductor chip 102 via a gold wire 104.

Formed on another surface of tape 106 are a plurality of solder balls 108 each electrically connected to pad electrode 107 via a predetermined wiring formed at tape 106. Semiconductor chip 102 is sealed on tape 106 by molded resin 110.

Fine-pitch BGA, allowing solder balls as electrode pins to be arranged in an array, is advantageous in forming more pins in a small package.

An another exemplary semiconductor device as a second prior art will now be described with reference to the drawings. FIG. 8 shows the configuration of a chip-scale package (referred to as a CSP hereinafter). Referring to FIG. 8, provided at a surface of semiconductor chip 102 are a plurality of external electrodes 109 each electrically connected to a predetermined region of semiconductor chip 102 via a metal wiring 111 and a pad electrode 107. Semiconductor chip 102 is sealed by molded resin 110.

The CSP, having approximately the same size as semiconductor chip 102, allows more pins to be formed. The CSP also allows mounting at high density since a relatively small area is required for mounting it on a substrate.

In the fine-pitch BGA and CSP described above, however, a relatively large amount of electricity is consumed and the semiconductor chip disadvantageously generates heat. Accordingly, various approaches have been taken for releasing such heat.

As a third prior art, an exemplary semiconductor device effectively releasing such heat will now be described based on a semiconductor device disclosed in Japanese Patent Laying-Open No. 7-50368. FIG. 9 is a cross section of the semiconductor device disclosed in Japanese Patent Laying-Open No. 7-50368. FIG. 10 is a plan view of the semiconductor device excluding a cap. Referring to FIG. 9, semiconductor chip 120 has a back surface fixed to a package 125 and is sealed in a space formed by a cap 123 and package 125. A gap is formed between an upper surface of semiconductor chip 120 and an inner surface of cap 123.

A power supply on semiconductor chip 120 is supplied from an external circuit via a pin 129, a wiring 127, an electrode for power supply 124, solder 132 and a pad for power supply 122. Signals between the external circuit and semiconductor chip 120 are communicated via a pin 130, a wiring 128, a lead 126, a bonding wire 131 and a bonding pad 121. Pad for power supply 122, formed at a surface of semiconductor chip 120, can be increased in area, as shown in FIG. 10.

In operation, the semiconductor device allows the heat generated at semiconductor chip 120 to be transferred to package 125 via the back surface of semiconductor chip 120 and also to cap 123 via pad for power supply 122, solder 132 and electrode for power supply 124. Thus, both package 125 and cap 123 can release heat, and the heat generated at semiconductor chip 120 can be sufficiently released to the environment.

Furthermore, the provision of electrode for power supply 124 and pad for power supply 122 allows reduction of the power supply to semiconductor chip 120 via bonding pad 121. Accordingly, bonding pad 121 can be used for signal communication between semiconductor chip 120 and the external circuit by the reduction. Thus, more bonding pads 121 can be used for signal communication than conventional.

However, the semiconductor device of the third prior art example described above has the disadvantages described below. Firstly, since the power for semiconductor chip 120 is supplied via electrode for power supply 124, semiconductor chip 120 does not require a bonding pad for power supply and can thus be provided with more bonding pads for signal communication instead. However, since the power is supplied to semiconductor chip 102 via pin 129 provided at package 125, the total number of pins 129 provided at a predetermined region of package 125 does not vary, which makes it difficult to provide any additional pin for signal communication in that region.

Secondly, while the heat transferred to cap 123 is more effectively released to the external when cap 123 and package 125 have larger surface area, it can fail to be sufficiently released with relatively small cap 123 and package 125.

SUMMARY OF THE INVENTION

The present invention is made to solve the disadvantages described above and contemplates a semiconductor device capable of sufficiently releasing the heat generated in operation while providing more pins for signal communication.

A semiconductor device in one aspect of the present invention includes a semiconductor chip, a packaging member, a power supply terminal portion and a plurality of signal terminal portions, and a power supply wiring portion. The packaging member houses the semiconductor chip. The power supply terminal portion and the plurality of signal terminal portions are arranged at the packaging member and are electrically connected to the semiconductor chip.

The power supply wiring portion is electrically connected to the power supply terminal portion and is provided external to the packaging member. The power supply terminal portion and the power supply wiring portion are arranged at a surface of the packaging member that is different from that surface of the packaging member at which a signal terminal portion is arranged.

According to this configuration, a power supply terminal portion is arranged at a surface of a packaging member that is different from that surface of the packaging member at which a signal terminal portion is arranged. Accordingly, an additional signal terminal portion can be provided on the surface for arranging the signal terminal portion at a region for otherwise arranging the power supply terminal portion, as in the example with the both terminal portions arranged at a same surface of the packaging member. Furthermore, the signal terminal portion arranged avoiding the surface for arranging the power supply terminal portion allows setting a larger wiring width of a power supply wiring portion connected to the power supply terminal portion and thus increasing the surface area of the power supply wiring portion. As a result, any heat transferred from the semiconductor chip via the power supply terminal portion to the power supply wiring portion can be efficiently released to the external.

Preferably, the power supply terminal portion and the power supply wiring portion are arranged at a surface of the packaging member opposite to that surface of the packaging member at which the signal terminal portion is arranged.

This example allows further increasing the wiring width of the power supply wiring portion. As a result, the heat of the semiconductor device can be released more efficiently.

Preferably, the semiconductor device includes a board provided with a predetermined wiring and mounted with the packaging member, and the power supply wiring portion covers the packaging member and is electrically connected to the predetermined wiring.

In this example, any heat generated can be transferred from the power supply wiring portion to a printed-circuit board to more efficiently release the heat. Also, the power supply wiring portion covering the packaging member can restrict electromagnetic interference with the semiconductor chip.

Still preferably, the semiconductor device includes a first printed-circuit board provided with a predetermined wiring electrically connected to a respective signal terminal portion and a second printed-circuit board provided with the power supply wiring portion, wherein the packaging member housing the semiconductor chip is arranged between the first and second printed-circuit boards.

In this example, the semiconductor device can be mounted at higher density in a limited space.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
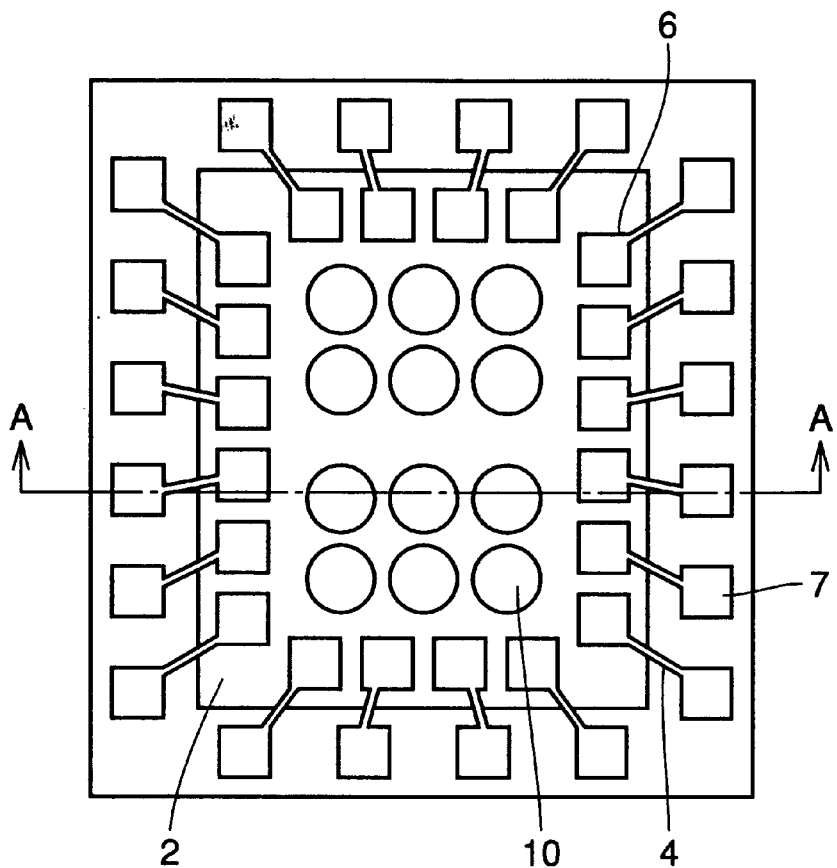
FIG. 1 is a plan view of the interior of a package of a semiconductor device according to a first embodiment of the present invention.
Figure 2:
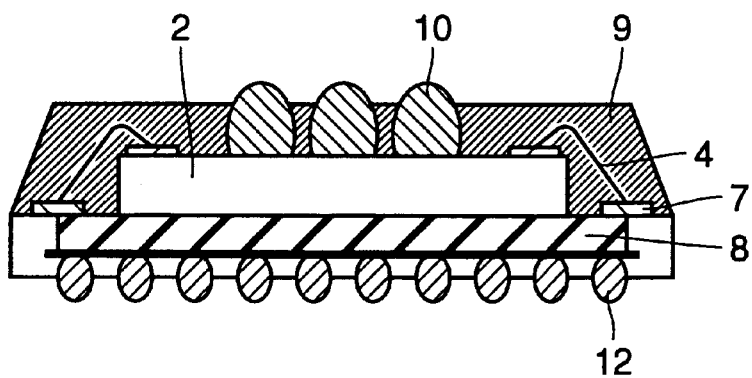
FIG. 2 is a cross section taken along line A—A shown in FIG. 1.

A semiconductor device according to a first embodiment of the present invention will now be described with reference to FIGS. 1–4. FIG. 2 is a cross section taken along line A—A of FIG. 1, and FIG. 4 is a cross section taken along line B—B of FIG. 3. Referring first to FIGS. 1 and 2, a semiconductor chip 2 is die-bonded on a tape 8. A plurality of bonding pads 6 are formed on a surface of semiconductor chip 2 near the periphery. A plurality of pad electrodes 7 are provided on a peripheral surface of tape 8.

Each bonding pad 6 is electrically connected to pad electrode 7 via a bonding wire 4. Formed on a surface of semiconductor chip 2 are a plurality of electrodes for power supply 10 as a power supply terminal portion for supplying power to semiconductor chip 2. Formed at a lower surface of tape 8 are a plurality of electrodes for signal communication 12 as a signal terminal portion for communicating signals with semiconductor chip 2. Semiconductor chip 2, tape 8 and the like are sealed in a package 9, such as molded resin.

Figure 3:
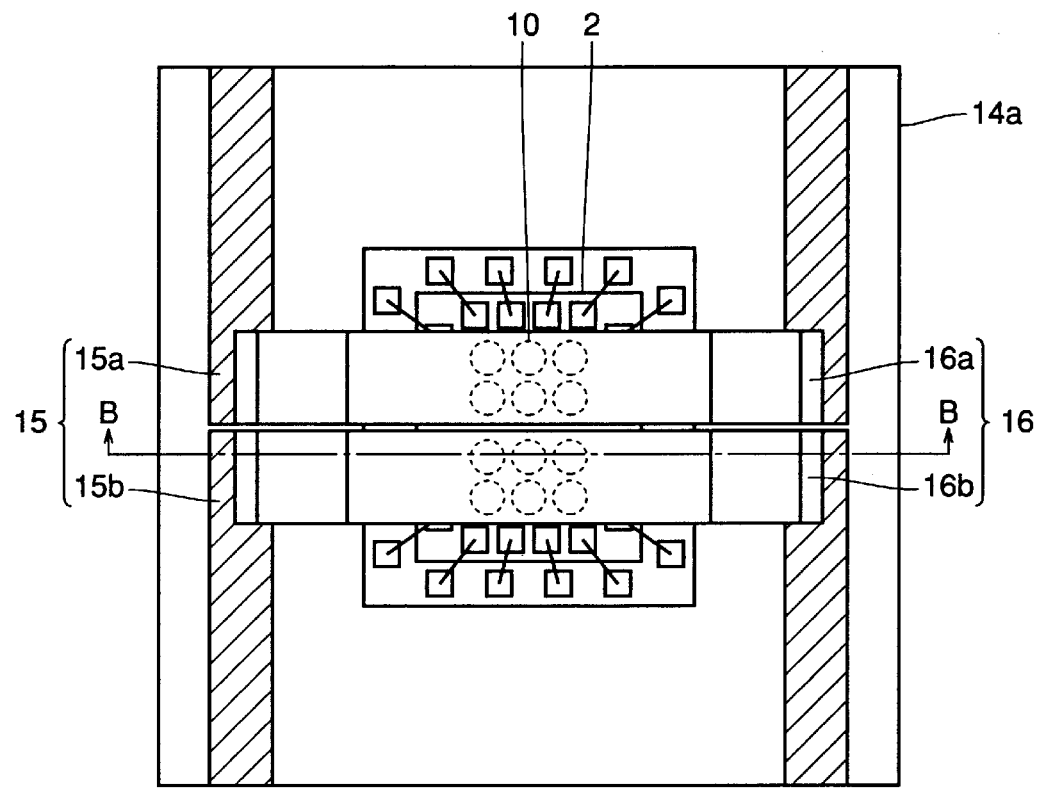
FIG. 3 is a plan view of the semiconductor device according to the first embodiment.
Figure 4:
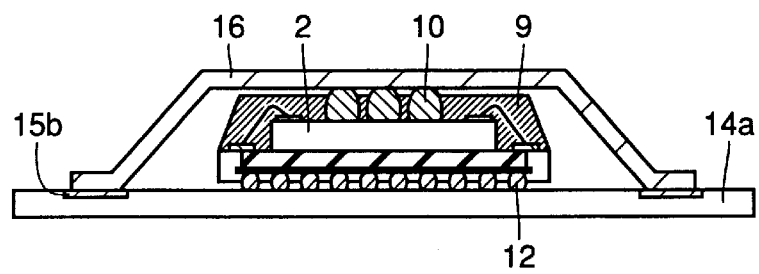
FIG. 4 is a cross section taken along line B—B of FIG. 3.

Referring further to FIGS. 3 and 4, electrode for power supply 10 is connected to a power supplying wiring 16 as a power supply wiring portion. Power supply wiring 16 includes a power supply (Vcc) wiring 16a and a GND wiring 16b. Each electrode for signal communication 12 is electrically connected to a predetermined wiring (not shown) formed at a surface of a printed-circuit board (PCB) 14a. Power supply wiring 16a and GND wiring 16b are electrically connected to a Vcc wiring 15a on the PCB and a GND wiring 15b on the PCB each formed at a surface of PCB 14a, respectively.

In the semiconductor device described above, electrode for power supply 10 is not arranged at that lower surface of package 9 at which electrode for signal communication 12 is arranged. Thus, an additional electrode for signal communication can be provided in the limited area of the package 9 at the lower surface at which the electrode for power supply is otherwise arranged.

Also, power supply wiring 16 connected to electrode for power supply 10 can be provided external to package 9 to apply a wiring of relatively increased width as power supply wiring 16. Any heat generated at semiconductor chip 2 can be transferred from bonding wire 4 to pad electrode 7 as well as from electrode for power supply 10 to power supply wiring 16 while wiring for power supply 16a can act as a heat-releasing fin to efficiently release the heat. Power supply wiring 16 can also transfer the heat to PCB 14a to further efficiently release the heat.

In order to mount a semiconductor device at high density, the package should be closer in size to the semiconductor chip. However, when the size of the package is reduced, the magnitude of the force which prevents heat from flowing in the package, i.e. thermal resistance, is increased. In particular, a semiconductor device mounted with a very high-speed semiconductor chip emits a large amount of heat and can thus fail to sufficiently release the heat only through the package. However, even if such a very high-speed semiconductor chip is mounted, the power supply wiring 16 and the like described above allows the heat generated at semiconductor chip 2 to be released efficiently.

Furthermore, power supply wiring 16 can cover the package 9 and thus function as a shield to restrict electromagnetic interference with semiconductor chip 2.

Furthermore, since semiconductor chip 2 receives power from electrode for power supply 10 relatively larger in diameter than bonding wire, electric resistance, inductance and the like can be restricted and semiconductor chip 2 can receive stable voltage.

Also, molded resin applied as the package, and solder applied to the electrodes for power supply and signal communication can relax the stress caused by the generated heat.

Second Embodiment

Figure 5:
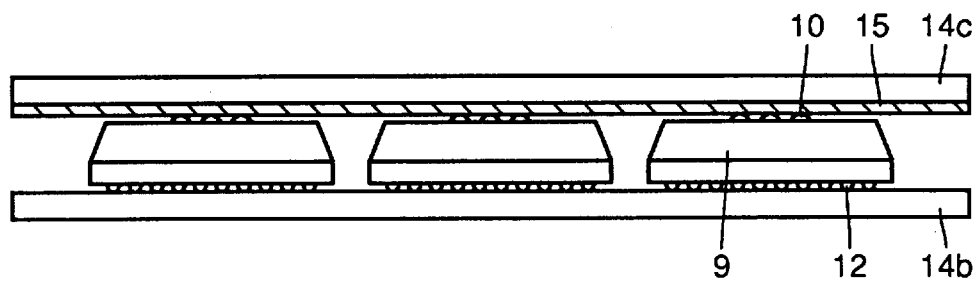
FIG. 5 is a side view of a semiconductor device according to a second embodiment of the present invention.

A semiconductor device according to a second embodiment of the present invention will now be described with reference to FIG. 5. Referring to FIG. 5, a package 9 mounted with a semiconductor chip is placed on a PCB 14*b*. Each electrode for signal communication 12 is electrically connected to a respective, predetermined wiring (not shown) formed at a surface of PCB 14*b*. Formed at one surface of PCB 14*c* is a power supply wiring 15 on the PCB that is electrically connected to an electrode for power supply 10 provided at package 9.

In this example, a wider wiring area for power supply wiring 15 can be ensured at a surface of PCB 14*c* to further efficiently release the heat transferred from electrode for power supply 10 to wiring for power supply 15. Also, semiconductor chip 2 can stably be supplied with power.

Figure 6:
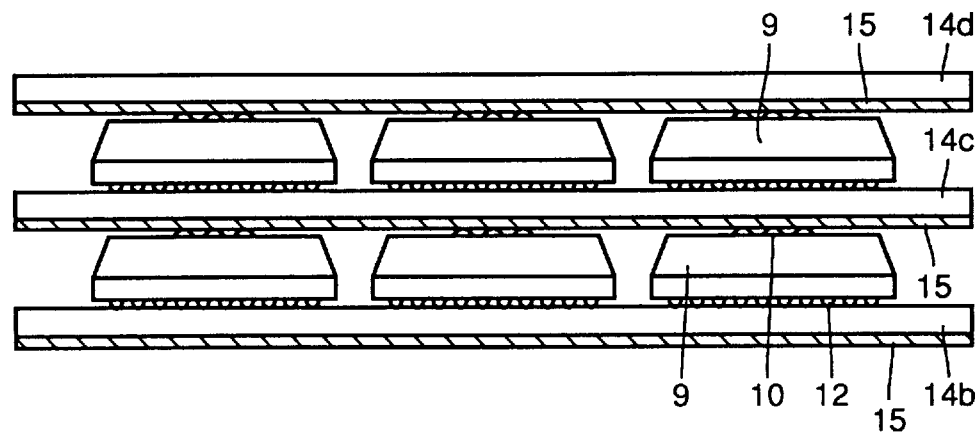
FIG. 6 is a side view of a variation of the semiconductor device according to the second embodiment.
Figure 7:
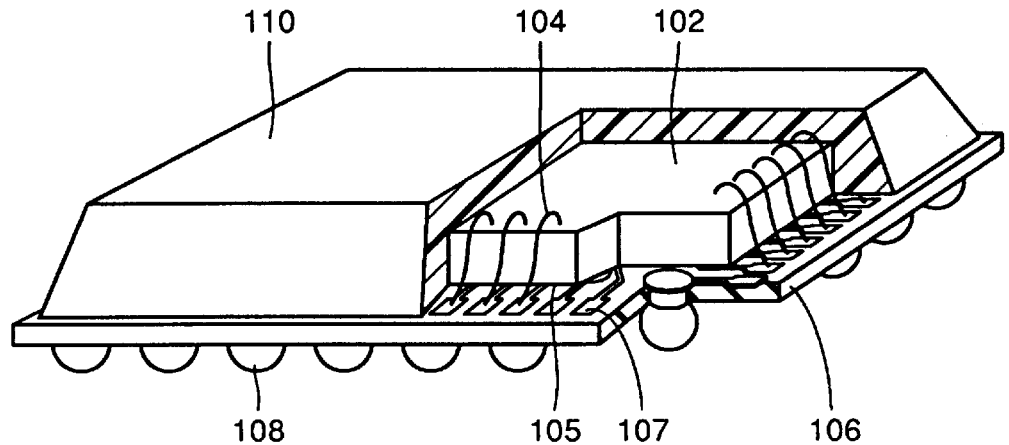
FIG. 7 is a perspective view showing a partial cross section of a semiconductor device according to a first prior art.
Figure 8:
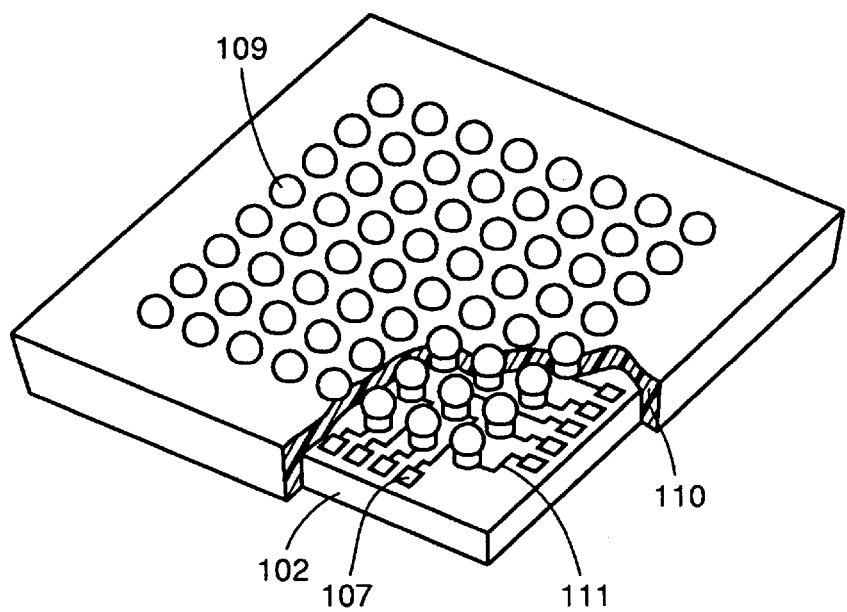
FIG. 8 is a perspective view showing a partial cross section of a semiconductor device according to a second prior art.
Figure 9:
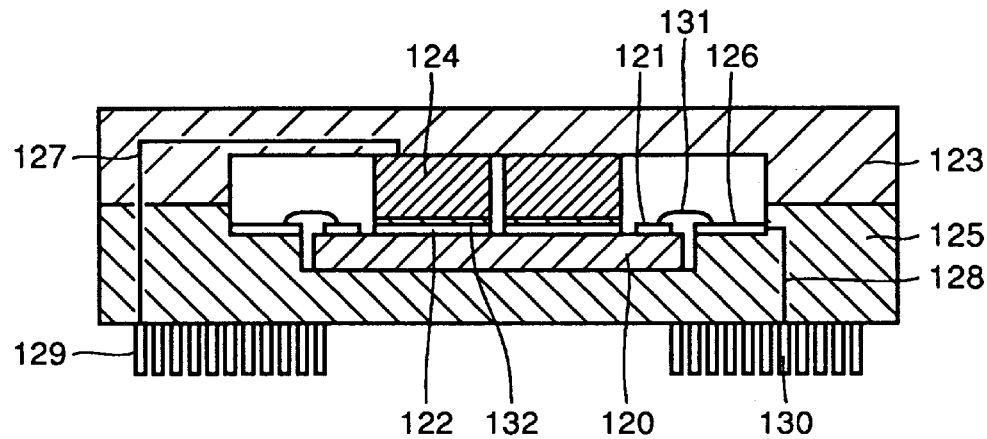
FIG. 9 is a cross section of a semiconductor device according to a third prior art.
Figure 10:
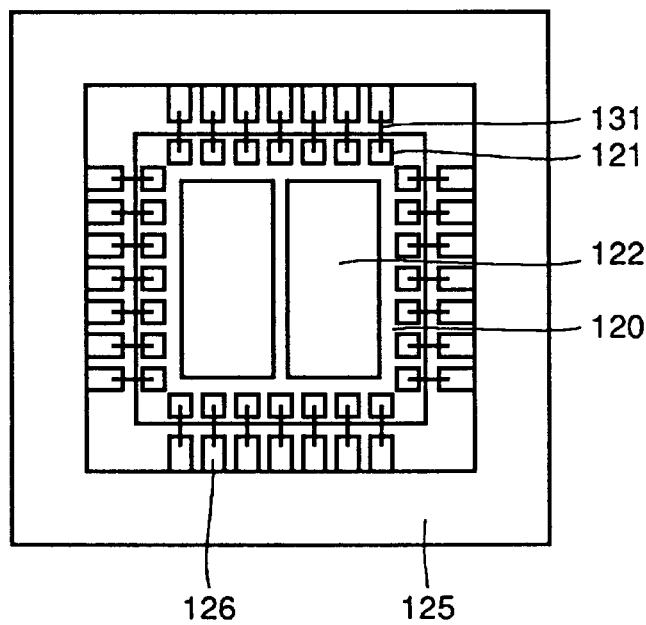
FIG. 10 is a plan view of the semiconductor device shown in FIG. 9.

Furthermore, by forming a predetermined printed wiring at the other surface of PCB 14*c*, another package 9 mounted with a semiconductor chip can be placed on PCB 14*c*, as shown in FIG. 6.

In this example, a plurality of PCBs 14*b,* 14*c* and 14*d* can be deposited to mount semiconductor devices at higher density in a limited space.

While the above embodiments provide electrode for power supply 10 formed at an upper surface opposite to that lower surface of package 9 at which electrode for signal communication 12 is formed, an electrode for power supply may be formed at a side surface of the package and the like in accordance with how the semiconductor device is mounted, so as to obtain the effect described above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor chip;

a packaging member for housing said semiconductor chip;

a power supply terminal portion and a plurality of signal terminal portions arranged at said packaging member and each electrically connected to said semiconductor chip; and a power supply wiring portion electrically connected to said power supply terminal portion for supplying power to said semiconductor chip; wherein a surface of said packaging member provided with said power supply terminal portion and said power supply wiring portion is different from a surface of said packaging member provided with said signal terminal; and wherein the surface of said packaging member provided with said power supply terminal portion and said power supply wiring portion is opposite to the surface of said packaging member provided with said signal terminal portion, and further comprising:

a first printed-circuit board provided with a predetermined wiring electrically connected to a respective said signal terminal portion; and a second printed-circuit board provided with said power supply wiring portion; wherein said packaging member housing semiconductor chip is arranged between said first and second printed-circuit boards.

2. A semiconductor device comprising:

a semiconductor chip;

a packaging member for housing said semiconductor chip;

a power supply terminal portion and a plurality of signal terminal portions arranged at said packaging member and each electrically connected to said semiconductor chip; and a power supply wiring portion electrically connected to said power supply terminal portion for supplying power to said semiconductor chip, said power supply wiring portion entirely in the form of a plate, a portion of said plate having a surface opposite to and substantially parallel to the chip; wherein a surface of said packaging member provided with said power supply terminal portion and said power supply wiring portion is different from a surface of said packaging member provided with said signal terminal; wherein said power supply terminal portion is arranged at a first surface of said chip, and a second surface of said chip is die-bonded with a taping member at a first surface of said taping member, said signal terminal portions being arranged at a second surface of said taping member.

3. A semiconductor device as recited in claim 2, wherein the surface of said packaging member provided with said power supply terminal portion and said power supply wiring portion is opposite to the surface of said packaging member provided with said signal terminal portion.

4. A semiconductor device comprising:

a semiconductor chip;

a packaging member for housing said semiconductor chip;

a power supply terminal portion arranged in said packaging member and connected to said chip at a first surface of said chip;

a plurality of signal terminal portions arranged at said packaging member and connected to said chip at a second surface of said chip; and an entirely plate-shaped conductive structure, electrically connected to said power supply terminal portion and provided for connection to a supporting printed circuit board external source connection, for supplying power to said semiconductor chip through said power supply terminal, said conductive structure having a surface opposite to and substantially parallel to the chip.

* * * * *